(12) United States Patent
Wolford et al.

(10) Patent No.: US 7,218,517 B2
(45) Date of Patent: May 15, 2007

(54) COOLING APPARATUS FOR VERTICALLY STACKED PRINTED CIRCUIT BOARDS

(75) Inventors: Robert Russell Wolford, Raleigh, NC (US); Donna Casteel Hardee, Raleigh, NC (US); Jimmy Grant Foster, Sr., Morrisville, NC (US); Don Steven Keener, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 272 days.

(21) Appl. No.: 11/006,247

(22) Filed: Dec. 7, 2004

(65) Prior Publication Data

US 2006/0120043 A1  Jun. 8, 2006

(51) Int. Cl.
*H05K 7/20* (2006.01)

(52) U.S. Cl. .................. 361/695; 361/719; 361/720; 361/721; 165/80.2; 174/16.1

(58) Field of Classification Search ............... None
See application file for complete search history.

(56) References Cited

U.S. PATENT DOCUMENTS

| | | | |
|---|---|---|---|
| 4,399,484 A | | 8/1983 | Mayer et al. |
| 4,536,824 A | | 8/1985 | Barrett et al. |
| 5,424,915 A | * | 6/1995 | Katooka et al. ............ 361/695 |
| 5,440,450 A | * | 8/1995 | Lau et al. .................... 361/695 |
| 5,694,294 A | * | 12/1997 | Ohashi et al. ............... 361/687 |
| 6,027,535 A | | 2/2000 | Eberle et al. |
| 6,052,282 A | | 4/2000 | Sugiyama et al. |
| 6,123,145 A | * | 9/2000 | Glezer et al. ........... 165/104.33 |
| 6,141,214 A | * | 10/2000 | Ahn ............................ 361/687 |
| 6,219,236 B1 | | 4/2001 | Hirano et al. |
| 6,226,182 B1 | * | 5/2001 | Maehara ..................... 361/695 |
| 6,483,699 B1 | | 11/2002 | Salmonson et al. |
| 6,490,159 B1 | | 12/2002 | Goenka et al. |
| 6,538,885 B1 | | 3/2003 | Azar |
| 6,574,108 B1 | | 6/2003 | Kramer et al. |
| 6,618,248 B1 | | 9/2003 | Dalheimer |
| 6,639,794 B2 | | 10/2003 | Olarig et al. |
| 6,661,657 B1 | | 12/2003 | Banton et al. |
| 6,801,430 B1 | * | 10/2004 | Pokharna .................... 361/695 |
| 6,909,602 B2 | * | 6/2005 | Dietrich et al. ............. 361/687 |

FOREIGN PATENT DOCUMENTS

| | | |
|---|---|---|
| GB | 2382932 A | 6/2003 |
| JP | 1286498 A | 11/1989 |
| JP | 2194598 A | 8/1990 |

* cited by examiner

*Primary Examiner*—Boris Chervinsky
(74) *Attorney, Agent, or Firm*—Cynthia S. Byrd; Dillon & Yudell LLP

(57) ABSTRACT

An apparatus, system and method for cooling vertically stacked printed circuit boards (PCBs). In one embodiment, a first PCB is disposed within a substantially enclosed lower chamber inside a PCB containment housing. A second PCB is disposed above the first PCB within the housing to define a substantially enclosed upper chamber above the lower chamber. The second PCB includes one or more airflow apertures defined therethrough and providing vertical air flow coupling between the upper and lower chambers. An airflow actuating device is utilized to generate a primary forced airflow within the upper chamber which is substantially parallel to the surface plane of the second PCB. The primary forced airflow further induces a negative air pressure in the upper chamber such that a mixed convection airflow is established between the upper and lower chambers via the second PCB apertures.

9 Claims, 2 Drawing Sheets

COOLING APPARATUS FOR VERTICALLY STACKED PRINTED CIRCUIT BOARDS

BACKGROUND OF THE INVENTION

1. Technical Field

The present invention relates generally to cooling printed circuit board components and in particular to an apparatus employing a mixed convection airflow mechanism for cooling vertically stacked printed circuit boards.

2. Description of the Related Art

With microelectronics technology steadily increasing integrated circuit (IC) chip density and the density in which such circuits are mounted onto system planar printed circuit boards (PCBs), cooling issues are becoming increasingly critical to design of large-scale data processing systems. Electronic systems containing densely packaged components typically utilize fans or blowers for forced-air cooling.

Systems for cooling electronic components mounted within a computer housing may provide circulation of a fluid coolant medium (usually air) by means of a distributed fan system adapted to circulate air throughout the housing. In concert therewith, or in the alternative, strategically positioned chambers, ducts, and baffles may be employed to distribute the forced-air coolant medium throughout the housing.

Current requirements for compact, lightweight electronic packages, containing, for example, a large number of closely spaced or stacked electronic circuit boards have not been fully satisfied by existing systems either because such systems provide an insufficient coolant flow to particular components due to such components being blocked from the coolant flow path by other components or boards, or because of the substantial additional hardware required to implement effective ducts and baffling structures.

A system and apparatus addressing some of these problems is described in U.S. Pat. No. 4,399,484 issued to Mayer. The cooling system described therein employs a forced air technique wherein a blower is utilized to drive a forced convection airflow generally perpendicular to the planar surfaces of a set of horizontally stacked circuit boards. The circuit boards have multiple airflow passages defined therethrough to facilitate passage of the coolant flow through the stacked boards. The forced-air system described by Mayer addresses some of the foregoing problems relating to cooling blocked components while minimizing cooling support infrastructure. However, implementation of such a system would result in uneven heat dissipation, with the aft-stacked boards (i.e. boards furthest from the blower source) receiving a disproportionately ineffective convection stream. Specifically, the speed of the coolant flow is greatly diminished following impingement with the first one or two boards thus reducing the convection heat removal effect. In addition, the forced air convection flow becomes heated as it sequentially passes through each successive board, thus greatly reducing the effectiveness of the air medium as a convective heat removal medium.

Therefore, a need exists for a need for an improved PCB cooling system that overcomes the aforementioned problems. The present invention addresses these and other needs unresolved by the prior art.

SUMMARY OF THE INVENTION

An apparatus, system and method for cooling vertically stacked printed circuit boards (PCBs) are disclosed herein. In one embodiment, a first PCB is disposed within a substantially enclosed lower chamber inside a PCB containment housing. A second PCB is disposed above the first PCB within the housing to define a substantially enclosed upper chamber above the lower chamber. The second PCB includes one or more airflow apertures defined therethrough and providing vertical air flow coupling between the upper and lower chambers. An airflow actuating device is utilized to generate a primary forced airflow within the upper chamber which is substantially parallel to the surface plane of the second PCB. The primary forced airflow further induces a negative air pressure in the upper chamber such that a mixed convection airflow is established between the upper and lower chambers via the second PCB apertures.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT(S)

The present invention is generally directed to an apparatus and method for cooling electronic components that may be housed within an electronics mounting package or chassis. In particular, the present invention is directed to improved housing and circuit board units adapted to provide a mixed convection coolant flow that promotes efficient and evenly distributed cooling across multiple board planes. In a preferred embodiment, the present invention is directed to providing enhanced cooling for vertically stacked printed circuit boards (PCBs).

Figure 1:
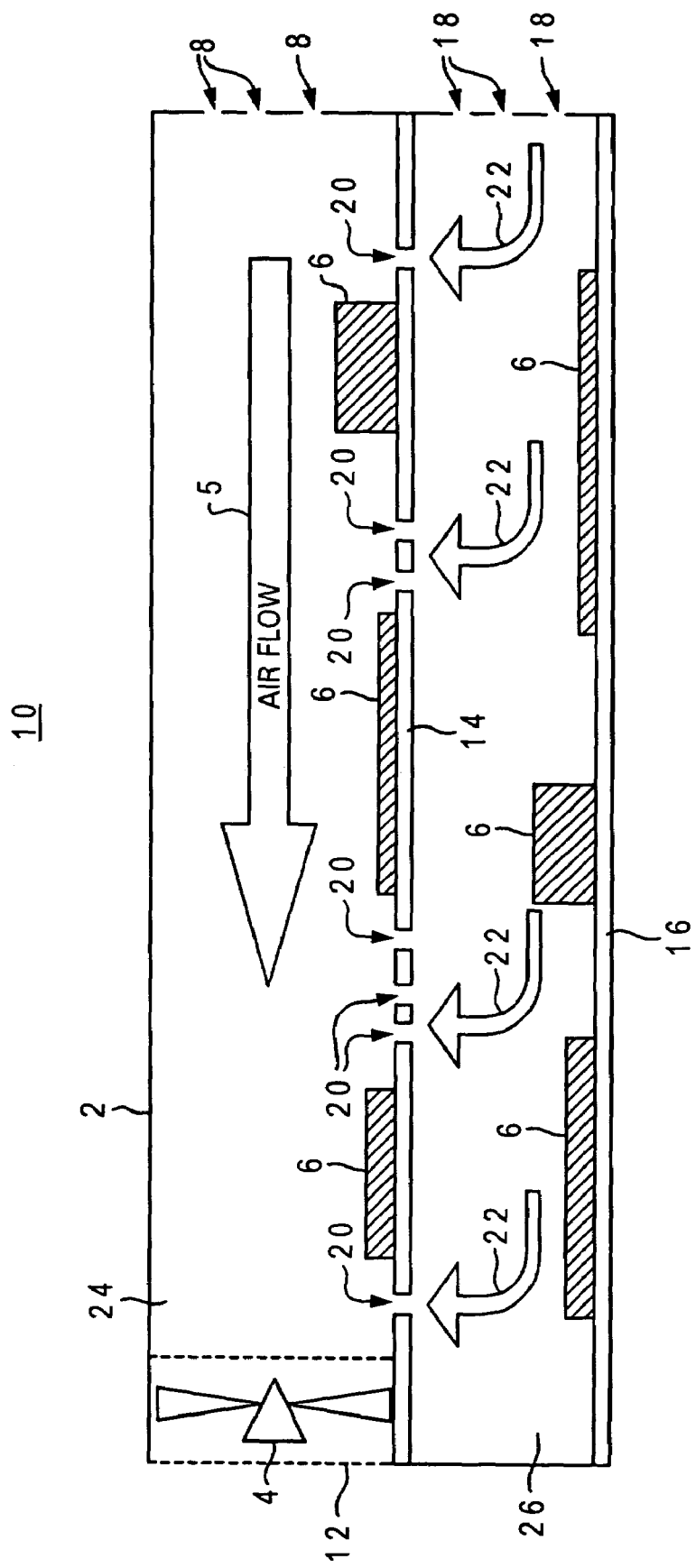
FIG. 1 is a partial cross-section view depicted a vertically stacked PCB apparatus in accordance with a preferred embodiment of the present invention.
Figure 2:
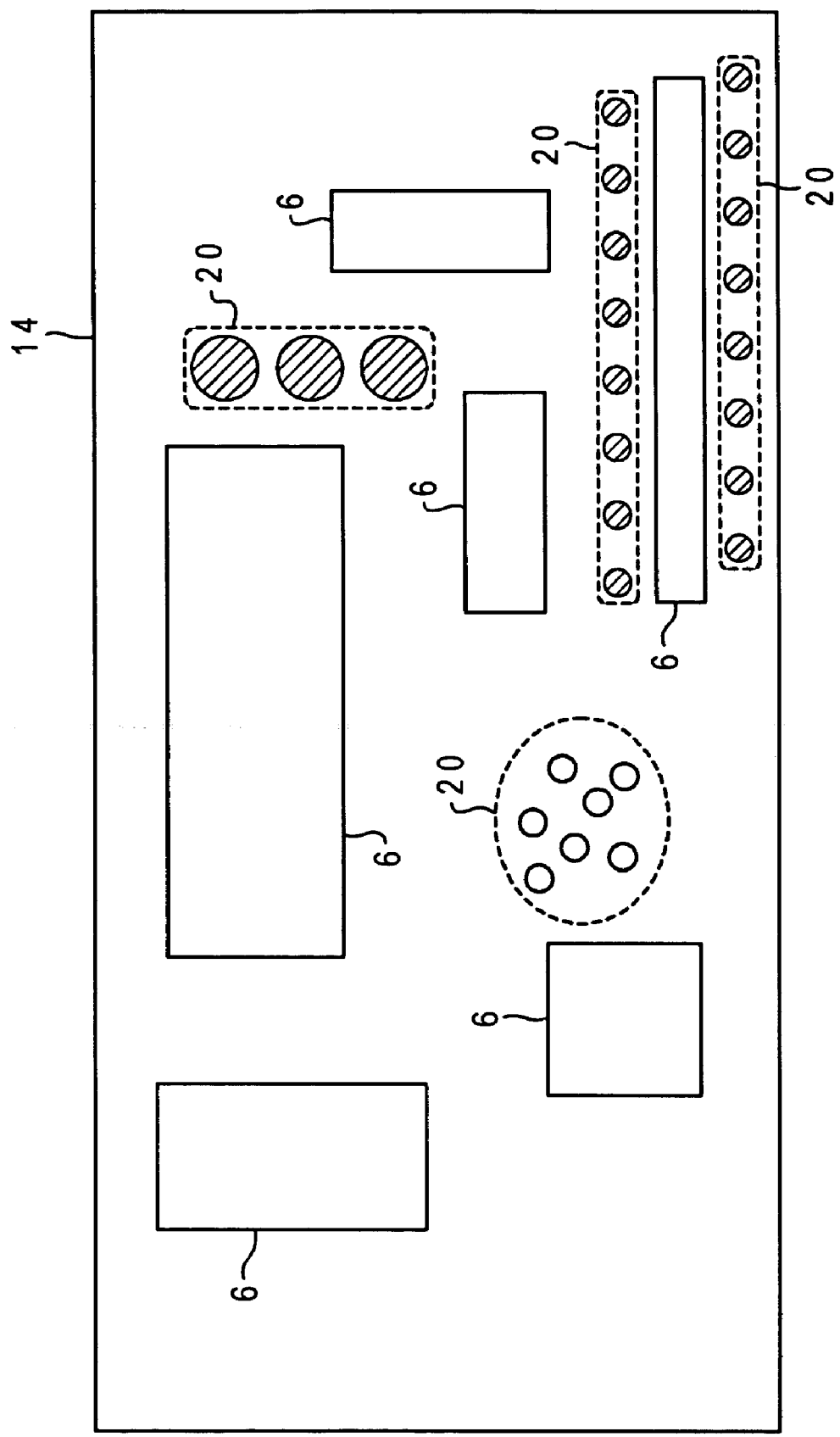
FIG. 2 illustrates an overhead view of an upper level PCB as may be employed in the PCB apparatus depicted in FIG. 1.

With reference now to the figures wherein like reference numerals refer to like and corresponding parts throughout, and in particular with reference to FIG. 2, there is illustrated an overhead view of an upper level PCB as may be employed in the PCB apparatus of the present invention. Specifically, an upper level PCB 14 is depicted which, as depicted and explained in further detail below with reference to FIG. 1, may be advantageously employed in the component cooling apparatus of the present invention. As utilized herein, "upper level," refers to the relative disposition of the board as being disposed in a parallel plane above one or more other PCBs to form a vertical PCB stack which may, for example, comprise a computer system planar. Consistent with conventional PCB design, upper level PCB 14 generally comprises a thin sheet of plastic having metallized tracks (not depicted) connecting multiple electronic components such as components 6 shown in the depicted embodiment. Components 6 may include integrated circuit (IC) chips, discrete components, transversely mounted daughtercards, etc.

As is known the art, computers generally comprise several PCBs, including so-call printed circuit cards. In an effort to reduce system footprint, so-called motherboards used as system planars employed by newer systems are increasingly using a vertical stacked multiple PCB approach. In accordance with the present invention, PCB 14 is employed within such a vertical stacked arrangement such that it is disposed above at least one other of the stacked boards. Furthermore, and as shown in FIG. 2, PCB 14 includes multiple vertical airflow apertures 20 formed through the PCB sheet layer. Vertical airflow apertures 20 may comprise many possible aperture contours but are preferably smooth and round to minimize turbulence and maximize airflow therethrough. The deployment of an upper level PCB conforming to the described characteristics of PCB 14 within a vertical stacked PCB arrangement is now described with reference to the preferred embodiment of the present invention depicted in FIG. 1.

Referring to FIG. 1, there is illustrated a partial cross-section view depicting a vertically stacked PCB apparatus 10 in accordance with a preferred embodiment of the present invention. PCB apparatus 10 generally comprises a substantially enclosed housing or containment unit 2 containing one or more vertically stacked PCBs. In the exemplary depicted embodiment, the one or more vertically stacked PCBs comprise an upper PCB, such as PCB 14 and a lower PCB 16, disposed in set spacing arrangement below PCB 14. In the manner depicted, PCB 14 and PCB 16 compartmentalize the interior enclosure of containment unit 2 into an upper PCB air chamber 24 and a lower PCB air chamber 26 wherein the vertical airflow apertures 20 comprise the dominant or only fluid communication between the chambers. Similar to PCB 14, PCB 16 includes electronic components and devices 6 many of which emit significant heat during operation within the containment unit. As explained above, prior art attempts to remove such heat include fan or blower systems often in combination with complex component and board placement schemes in order to dissipate the component-emitted heat. Furthermore, cooling of vertically stacked PCBs introduces additional logistical problems that are currently addressed by relatively complex and costly overhead devices such as the use of miniature fansinks, heatpipes, and peizo cooling devices.

The present invention provides a low overhead design that generates a mixed convection flow to provide an efficient and cost effective stacked PCB cooling mechanism. Referring again to FIG. 1, vertical stacked PCB apparatus 10 further comprises features and mechanisms for facilitating evenly distributed (in terms of flow medium temperature and flow velocity) cooling of the components 6 mounted on each of PCBs 14 and 16. Specifically, an air flow actuating device in the form of a fan unit 4 is disposed at one end of the upper chamber 24 and is utilized to draw, blow or otherwise induce a primary air flow current 5 across the top of PCB 14, which includes multiple perforations in the form of vertical airflow apertures 20. In accordance with the depicted embodiment, fan unit 4 is positioned and directed such that the resultant primary air flow 5, drawn from one or more air chamber inlets 8, flows in a direction substantially parallel to the upper board plane of PCB 14. An exhaust outlet port 12 is disposed proximate fan 4 to facilitate the directed air flow 5. It should be noted that fan 4 may be replaced by a suitable blower device with the direction of air flow 5 reversed without departing from the spirit or scope of the present invention.

Mechanically driven by fan 4, the primary air flow 5 provides a forced air convection medium for cooling components 6 mounted on the surface of PCB 14. In an important feature of the present invention, primary air flow 5 further induces a negative air pressure within upper air chamber 24. This vacuum effect is most pronounced at the open mouths of vertical airflow apertures 20. As a result, and assisted by Bernoulli effect principles whereby the pressure drop through the apertures 20 promotes increased air flow velocity, air is forcibly drawn from lower PCB chamber 26 through vertical air flow apertures 20 and into the upper chamber 24 where it is ejected through fan exhaust outlet 12. In this manner a forced air flow drawn from secondary containment unit inlet apertures 18 flows over and draws heat in accordance with convection heat transfer principles from the components 6 mounted on lower PCB 16. As shown in the exemplary embodiment, PCB 14 preferably includes apertures 20 that are distributed substantially the length of PCB 14 (in the depicted flow direction cross-section) to facilitate even secondary airflow within and from lower chamber 26. Furthermore the vacuum-drawn convection airflow is joined by the natural convection airflow occurring over and in proximity to heat emitting components 6 to form a combined flow, referred to herein as a "mixed convection" airflow 22.

The mixed convection airflow 22 flowing across lower PCB 16 and upwardly though apertures 20 results from the depicted mutual configuration and orientation of the devices included within stacked PCB apparatus 10 and provides an efficient heat removal mechanism for vertically stacked PCBs while minimizing cooling apparatus overhead. Furthermore, the apparatus 10 avoids the considerable structural and design constraints typically employed to ensure adequate air flow access to board components. For example, the ability to establish the mixed convection air flow for lower chambers is particularly advantageous for systems in which for logistical reasons a direct fan airflow cannot be applied in one or more lower chambers such as when one or more of the chamber sides are blocked. It should be noted that while the example embodiment depicts only two PCBs 14 and 16, the principle of the invention is also applicable to stacked PCBs having any number of constituent boards and chambers.

While the invention has been particularly shown and described with reference to a preferred embodiment, it will be understood by those skilled in the art that various changes in form and detail may be made therein without departing from the spirit and scope of the invention.

What is claimed is:

1. An apparatus for cooling vertically stacked printed circuit boards (PCBs) comprising:
   a first PCB disposed within a containment unit;
   a second PCB disposed vertically above said first PCB and defining the boundary between a substantially enclosed upper chamber and a substantially enclosed lower chamber within the containment unit, said second PCB having one or more airflow apertures providing vertical air flow coupling between said upper and lower chambers, wherein the airflow apertures are distributed substantially the length of the second PCB along the direction of the primary forced airflow; and
   an airflow actuating device for generating a primary forced airflow within said upper chamber.

2. The apparatus of claim 1, wherein said airflow actuating device is a fan or blower device.

3. The apparatus of claim 2, further comprising one or more air inlet apertures disposed in opposition to said fan or blower.

4. The apparatus of claim 1, wherein said airflow actuating device is disposed relative to said upper chamber such that the primary forced airflow is substantially directed is parallel to the upper surface of said first PCB.

5. The apparatus of claim 1, wherein said airflow actuating device and said second PCB are mutually oriented such that the primary forced airflow induces a negative air pressure in said upper chamber such that a mixed convection airflow is induced through said one or more apertures from said lower chamber to said upper chamber.

6. A method for cooling vertically stacked printed circuit boards (PCBs), said method comprising:

positioning a first PCB within a containment unit;

positioning a second PCB above the first PCB within the containment unit to define a substantially enclosed upper chamber and a substantially enclosed lower chamber, said second PCB defining the boundary between the upper and lower chambers and having one or more airflow apertures providing vertical air flow coupling between the upper and lower chambers, wherein the airflow apertures are distributed substantially the length of the second PCB along the direction of the induced primary forced airflow; and inducing a primary forced airflow within the upper chamber.

7. The method of claim 6, wherein said inducing a primary forced airflow comprises actuating a fan or blower device mounted on one end of the upper chamber.

8. The method of claim 6, wherein an airflow actuator device is utilized for inducing a primary forced airflow within the upper chamber, said method further comprising positioning the airflow actuating device relative to the upper chamber such that the primary forced airflow is substantially directed in parallel to the upper surface of said first PCB.

9. The method of claim 6, further comprising mutually positioning the airflow actuating device and the second PCB such that the primary forced airflow induces a negative air pressure in the upper chamber such that a mixed convection airflow is induced through said one or more apertures from said lower chamber to said upper chamber.

* * * * *